United States Patent

Kuo et al.

[11] Patent Number: 6,117,282
[45] Date of Patent: Sep. 12, 2000

[54] METHOD OF PRODUCING AMORPHOUS CO-TB MAGNETIC RECORDING THIN FILMS

[76] Inventors: Po-Cheng Kuo; Chih-Ming Kuo, both of No. 1, Sec. 4, Roosevelt Rd., Taipei, Taiwan

[21] Appl. No.: 08/935,739

[22] Filed: Sep. 23, 1997

[51] Int. Cl.[7] .................................................. C23C 14/35
[52] U.S. Cl. ................................... 204/192.2; 204/192.15
[58] Field of Search ..................... 204/192.12, 192.15, 204/192.2, 298.13; 427/130; 148/301, 304, 313; 420/435

[56] References Cited

U.S. PATENT DOCUMENTS

| | | | |
|---|---|---|---|
| 4,202,022 | 5/1980 | Imamura et al. | 360/114 |
| 4,620,872 | 11/1986 | Hijikata et al. | 75/246 |
| 4,745,510 | 5/1988 | Watanabe et al. | 360/131 |
| 4,895,592 | 1/1990 | Hatwar et al. | 75/10.14 |
| 5,372,657 | 12/1994 | Hanaue et al. | 148/304 |
| 5,382,345 | 1/1995 | Huang et al. | 204/298.27 |
| 5,736,235 | 4/1998 | Matsuda et al. | 428/212 |

FOREIGN PATENT DOCUMENTS

| | | | |
|---|---|---|---|
| 59-200762 | 11/1984 | Japan | C23C 15/00 |
| 6-2131 | 1/1994 | Japan | C23C 14/34 |

*Primary Examiner*—Nam Nguyen
*Assistant Examiner*—Steven H. VerSteeg
*Attorney, Agent, or Firm*—Bacon & Thomas

[57] ABSTRACT

A method of producing SiNx protected amorphous Co-Tb thin films with high coercivity for longitudinal and perpendicular magnetic recording media is described. The method includes magnetron sputtering at controlled sputtering power and sputtering argon gas pressure to form a selective composition of amorphous Co-Tb thin film on a low temperature substrate. After the Co-Tb film is deposited, a protective SiNx layer with thickness of 100 Å was produced on the film. The as-deposited film has an amorphous structure with a high value of coercivity, and its magnetic easy-axis is perpendicular to the film plane. This film can be used as a perpendicular magnetic recording medium. After low temperature annealing at controlled conditions for a desirable temperature and time period in vacuum, the film also has an amorphous structure but its magnetic properties are isotropic. This film can be used as a longitudinal magnetic recording medium.

11 Claims, 7 Drawing Sheets

METHOD OF PRODUCING AMORPHOUS CO-TB MAGNETIC RECORDING THIN FILMS

BACKGROUND OF THE INVENTION

1. Field of the Invention

This invention includes two parts: (1) a method for producing amorphous Co-Tb perpendicular magnetic recording thin films, and (2) a method for producing amorphous Co-Tb longitudinal magnetic recording thin films.

2. Description of the Prior Art

Recently, the amount of information storage has increased rapidly due to the rapid development of the computer industry. In order to get high recording density, the magnetic recording media have been improved from the conventional y-$Fe_2O_3$ particle system to the thin film media. A high recording density thin film medium needs high coercivity (Hc) and optimum saturation magnetization (Ms) for MR and GMR magnetic heads.

The most important problem in recording medium is how to increase recording density. At present, the CoCrM (M=Ni, Ta, Pt) crystalline thin films and columnar grains CoCr films are the most widely used longitudinal and perpendicular magnetic recording materials respectively, due to their high coercivity (Hc=1500–2400 Oe). For these crystalline films, the most significant problem is the noise that results from magnetic exchange coupling between grains located at domain transition regions (Jian-Gang Zhu, "Transition Noise Properties in Longitudinal Thin Film Media", IEEE Trans. Magn. Vol.29, no.1, pp.195–200, 1993). Otherwise, intergranular voids, stacking faults, crystallographic orientation, etc., all will decrease magnetic performance (Shaun E. Mckinlay, Nina Fussing, and Robert Sinclair, "Microstructure/Magnetic Property Relationships in CoCrPt Magnetic Thin Films", IEEE Trans. Magn. Vol.32, no.5, pp.3587–3589, 1996). Practically, if we want to increase the areal recording density of the crystal film, the grain size of the film must be reduced (D. N. Lambeth, E. M. T. Velu, G. H. Bellesis, L. L. Lee, and D. E. Laughlin, "Media for 10 Gb/$in^2$ Hard Disk Storage: Issues and Status", J. Appl. Phys., 78(8), pp.4496–4501, 1996). However, when the grain size of the film is smaller than single-domain size, grains will become superparamagnetic particles and coercivity of the film decreases rapidly due to thermal fluctuation. The recording bit size is limited by the single-domain size.

Although the fabrication of a thin film with single-domain nanocrystal particles could be achieved by various methods (J. Nakai, M. Kuwabara, A. Kikuchi, T. Sakurai, T. Shimatsu and M. Takahashi, "Effect of Microstructure on Media noise of CoCrTa Thin Film Media Fabricated Under Ultra Clean Sputtering Process", IEEE Trans. Magn. Vol. 31, no.6, pp.2833–2835, 1995 G. Choe, "Effect of Film Morphology on Grain Boundary Segregation Induced Magnetic Properties in Heat Treated CoCrPt/Cr Films", IEEE Trans. Magn. Vol. 31, no.6, pp.2809–2811, 1995 I. Kaitsu, A. Inomata, I. Okamoto, and M. Shinohara, "Magnetic Properties and Structure of (Co-alloy)-$SiO_2$ Granular films" IEEE Trans. Magn., Vol.32, no.5, pp.3813–3815, 1996 G. Zangari and D. N. Lambeth, "Porous Aluminum Oxide Templates for Nanometer-sized Magnetic Arrays", Intermag"97, Paper FC-01, 1997), Gaussian distribution of particle size often occurs during the fabrication of thin films. It is difficult to obtain uniform single-domain particles. Some of the particles will be multi-domain particles and some of the others will be superparamagnetic particles. Moreover, the distance between the particles is uncontrollable. Each bit of data is stored over at least several particles and the recording density is difficult to increase.

For overcoming the disadvantages described above, we invented those using high coercivity amorphous Co-Tb thin films as longitudinal and perpendicular magnetic recording media. If the read-write ability of a magnetic head is strong enough, the recording bits of this amorphous film can be reduced to uniformly isolated single-domain size with the desired shape and smallest distance between neighboring recording bits without grain boundary or crystallographic orientation problems. Thus, the recording density could be increased enormously. The high coercivity amorphous Co-Tb thin films produced by this invention may be one of the most promising candidates for future high-density magnetic recording either in longitudinal recording or perpendicular recording. For the as-deposited amorphous Co-Tb thin film, its perpendicular coercivity ($Hc_\perp$) is higher than 6000 Oe and its saturation magnetization (Ms) is higher than 100 emu/$cm^3$. This film can be used as a perpendicular magnetic recording medium for ultra-high density magnetic recording. For the annealed amorphous Co-Tb thin film, it has nearly magnetic isotropy properties. Its inplane coercivity ($Hc_\parallel$) is equal to 2080 Oe and its saturation magnetization (Ms) is about 100 emu/$cm^3$. This film can be used as longitudinal magnetic recording medium.

Amorphous Co-Tb films have been studied by many investigators. They were all applied in magneto-optical recording. Until now, the amorphous TbCo thin films have never been used in magnetic recording. The magnetic properties demanded for magneto-optical recording media are different from that of magnetic recording media. According to the literature (T. Niihara, S. Takayama, K. Kaneko, and Y. Sugita, "Perpendicular Anisotropy of Tb-Co Amorphous Films Sputtered in $H_2$-added Ar gas", Appl. Phys. Lett. 45(8), pp. 872–874, 1984; T. Niihara, S. Takayama and Y. Sugita, "Perpendicular Anisotropy in Tb-Fe and Tb-Co Amorphous Films Sputtered in $H_2$-added Ar gas", IEEE Trans. Magn. Vol.21, no.5, pp.1638–1640, 1985), they added $H_2$ in Ar sputtering gas for improving perpendicular anisotropy of amorphous TbFe/TbCo films, their Tb contents range from 20 at. % to 30 at. %. They investigate the correlation between $H_2$ partial pressure, perpendicular anisotropy constant (Ku), saturation magnetization (Ms), and internal stress of the film. The coercivities of their films are not reported, and their sputtering gas is a mixture of $H_2$ and Ar gases that is different from this invention (in this invention, the sputtering gas is pure Ar gas). Their films are used in magneto-optical recording and our films are used in magnetic recording, the applications are different. The other literature (Seiji Yoshino, Hiroshi Takagi, and Shigeru Tsunashima, Mroio Masuda and Susumu Uchiyama, "Perpendicular Magnetic Anisotropy of TbCo Films", Japan. J. Apply. Phys., 23, pp.188–191, 1984) studied the perpendicular anisotropy constant Ku of the TbCo films prepared at substrate bias voltage of −100 volts. They found that Ku decreased considerably after annealing. Tb contents of their films are lower than 25 at. %, the Ms values and the coercivities of these films are not reported. In this invention, the substrate is not biased and Tb content of the Co-Tb film must be higher than 25 at. % in order to get high coercivity. Another literature (M. Ohkoshi, M. Harada, T. Tokunaga, S. Honda and T. Kusuda, "Effects of Ar Pressure and Substrate Bias on Magnetic Properties and Microstructure in Amorphous TbCo Sputtered Films", IEEE Trans. Magn. Vol.21, no.5, pp.1635–1637, 1985), amorphous $Tb_xCo_{100-x}$(x=19, 21,24), describes that films were prepared by r.f. diode sputtering with various Ar pressures and the substrate is biased with a negative voltage between 100 and 150 volts. They investigate the correlation between perpendicular anisotropy constant (Ku), saturation magnetization (Ms), sputtering Ar pressure, and biased voltage. These films all exhibited perpendicular anisotropy and were applied in magneto-optical recording. The coercivities of these films are not reported and Tb contents of the films are lower than 25 at. %. In this invention, if we want to get high coercivity, Tb content of the Co-Tb film must be higher than 25 at. % and the substrate is not biased. Our amorphous Co-Tb films are applied in magnetic recording. Further investigations (S. Honda, M. Ohkoshi and T. Kusuda, "Change of Magnetic Properties in Compositionally Modulated TbCo Sputtered Films", IEEE Trans. Magn. Vol.22, no.5, pp.1221–1223, 1986) studied the compositionally and morphologically modulated TbCo films that were annealed at 300 for 6 hours in a vacuum. Their substrate is biased with an alternately negative voltage between 0 and 100 volts. The films have 12–36 layers (layer thickness is 80–250 Å). They found a maximum coercivity of about 7 kOe at Tb=20.3%, its Ms value is 30 emu/cm$^3$. However, its microstructure has been changed due to oxidation during long period and high temperature annealing. Since their TbCo film is annealed at 300 for 6 hours, it may be crystallized. Because the crystallization temperature of amorphous TbCo film is about 270 (P. Hansen, in "Handbook of Magnetic Materials", ed. by K. H. J. Buschow, (Elsevier Sci. Publ. B. V., 1991), Vol.6, Chap. 4, p.310). Their TbCo films are nanocrystalline films and not pure amorphous films. In this invention, the substrate is not biased and the annealing temperature is 250° C. which is lower than the crystallization temperature of amorphous Co-Tb film. So, the structure of annealed Co-Tb film is still an amorphous structure. And the Ms value of the amorphous Co-Tb film is equal to 100 emu/Cm$^3$.

SUMMARY OF THE INVENTION

The first object of the present invention is to fabricate the amorphous Co-Tb thin films for perpendicular magnetic recording media. The maximum perpendicular coercivity (Hc$_\perp$) of the film produced in this invention can up to 6500 Oe and its saturation magnetization (Ms) is about 130 emu/cm$^3$. The second object of this invention is to fabricate a magnetic isotropic amorphous CoTb alloy thin film. The in-plane coercivity (Hc$_\parallel$) of this amorphous film can up to 2080 Oe, and its Ms value can be attained to about 100 emu/cm$^3$. This amorphous thin film can be used as longitudinal magnetic recording medium.

These two kinds of amorphous Co-Tb thin films have not been obtained by the prior art. An amorphous Co-Tb alloy thin film with magnetic easy-axis perpendicular to film plane was prepared by sputtering a Co-Tb alloy target or a composite target comprised of a Co disk and the Tb pieces. After undergoing an optimum heat treatment, an amorphous Co-Tb alloy thin film with isotropic magnetic properties is obtained.

BRIEF DESCRIPTION OF THE DRAWINGS

The present invention will be described in detail with reference to the accompany drawings, in which FIG. 1. is a diagram illustrating the variation of coercivities with Tb content of the as-deposited Co-Tb films. The dashed line is the in-plane coercivity (Hc$_\parallel$) and the solid line is the perpendicular coercivity (Hc$_\perp$). The sputtering power is 40 W and the Ar pressure is 3 mTorr.

DETAILED DESCRIPTION OF THE PREFERRED EMBODIMENT

Figure 1:
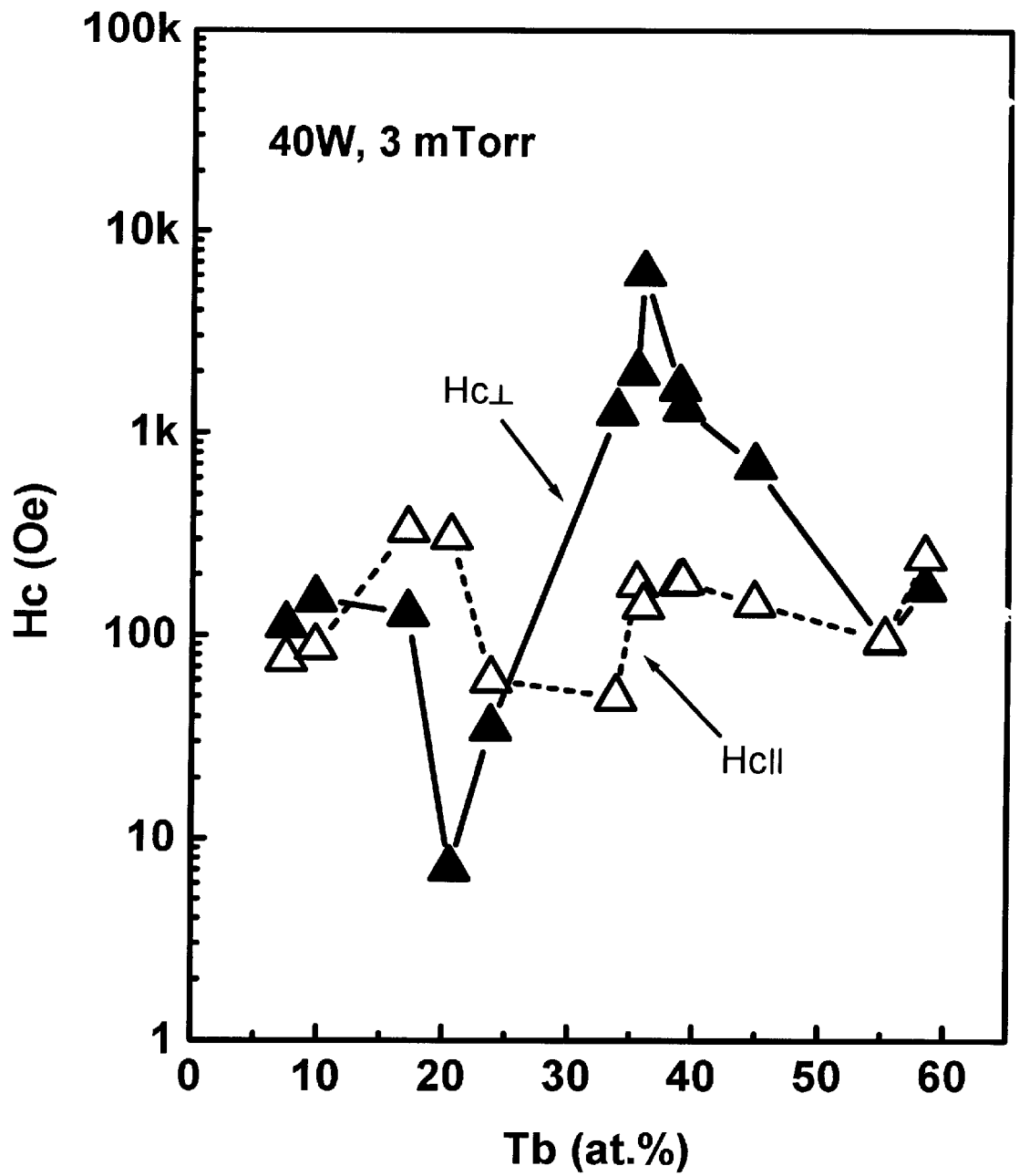

The Co-Tb thin films were deposited on a glass substrate at room temperature by magnetron sputtering. A protective SiNx layer with thickness of 100 Å was produced from a Si wafer target by dc magnetron reactive sputtering. The Co-Tb magnetic layer was sandwiched between SiNx and a glass substrate. The as-deposited Co-Tb film has an amorphous structure and its magnetic easy-axis is perpendicular to film plane. This film can be used as a perpendicular magnetic recording medium. After low temperature annealing, the film also has amorphous structure but it has isotropic magnetic properties. This film can be used as a longitudinal magnetic recording medium.

Amorphous Co-Tb thin films of this invention are prepared by a conventional magnetron sputtering system with a DC or RF power supply. Two types of targets were used in this invention; one is a composite target consisting of a cobalt (Co) disk overlaid with small terbium (Tb) pieces. This arrangement provides a wide range of effective target compositions and therefore film's compositions, the other one is an alloy target which was prepared by vacuum arc melting of Co and Tb together under a protective argon (Ar) atmosphere. The cast ingot is homogenized by treating in an Ar atmosphere then machined into a disk target or crushed and triturated into a powder then hot pressed into a disk target. Alloy constituents may be obtained from commercial grade raw material which typically are at least 99.9 percent purity for Co and at least 99.5 percent purity for Tb. Typical impurities in Tb are Fe, Ca, Dy, Si, Y, Gd, and Ho. The alloy composition is preferably in the range of 21 to 48 atomic percent Tb. For optimized magnetic properties a more narrow range of 35 to 40 atomic percent Tb is preferred. The conventional magnetron sputtering system was used to prepare the amorphous Co-Tb alloy thin films. The base pressure in the system was 10$^{-6}$ Torr or lower, and after the high purity Ar gas was introduced, the sputtering pressure P$_{Ar}$, was set at 0.3~10 mTorr. Magnetic properties of the Co-Tb film are dependent on P$_{Ar}$. In order to get high magnetic properties, the P$_{Ar}$ of 0.5~5 mTorr is preferred and a deposition rate of 3~5 Å/sec can be obtained at an input DC power of 40 W.

After deposition, a protective SiNx layer with thickness of 100 Å was produced from Si wafer target by dc magnetron reactive sputtering. The sputtering pressure was 5 mTorr with a mixture of Ar and N$_2$ gases.

A glass substrate was used, and the substrate temperature was maintained at 25° C. during the sputtering process. However, if the substrate is heated above 78° C. by a heating element the magnetic properties of the Co-Tb film will decrease rapidly. This is due to the formation of small low magnetic property crystalline particles in the film.

The differences between this invention and prior art can be summarized as follows:

(1) In this invention, the amorphous Co-Tb thin films were used as longitudinal and perpendicular magnetic recording media. (In the prior art, the Co-Tb amorphous thin films have never been used as longitudinal or perpendicular magnetic recording media.)

(2) In this invention, in order to get a good amorphous type Co-Tb thin film, the optimum substrate temperature and sputtering power during deposition are near 25° C. and 40 W, respectively. Since the crystal phase is a high temperature phase, low substrate temperature can induce the formation of the amorphous type Co-Tb thin film during deposition.

(3) In order to obtain high magnetic properties amorphous Co-Tb thin film for perpendicular recording, the composition of the as-deposited amorphous Co-Tb thin film must be close to $Co_{65}Tb_{35}$. When the content of Tb is beyond 50 at. %, the excess of Tb atoms will lead to the decrease of out-plane Hc and Ms.

(4) In this invention, the pure amorphous Co-Tb thin film for longitudinal recording was formed by the magnetic easy-axes transformation reaction, i.e. a high perpendicular magnetic anisotropic thin film was formed preliminary, and then it was transferred to magnetic isotropic type after an annealing treatment.

(5) In this invention, in order to keep good amorphous type thin film the optimum annealing temperature and annealing time are near 250° C. and 60 minutes, respectively. Since the crystal phase is a high temperature phase, low annealing temperature can keep the thin film amorphous.

More examples and experimental results of the invention will be set forth below to affirm the above conclusion. Magnetic properties of the films were measured with vibrating sample magnetometer (VSM) at room temperature. Microstructure of the films was characterized by transmission electron microscopy (TEM). Composition and homogeneity of the films were determined by energy disperse X-ray diffractometer (EDX).

EXAMPLE 1

Figure 2:
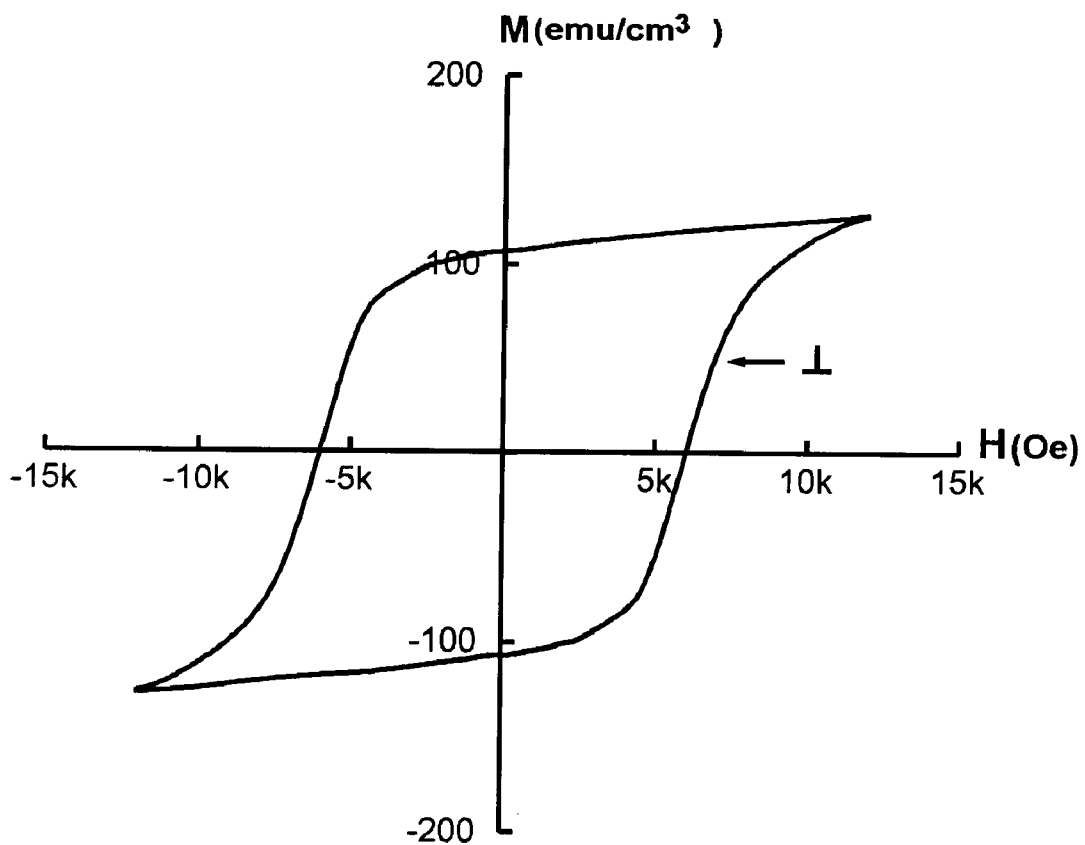
FIG. 2. is a diagram of the M-H loop of the Co$_{64}$Tb$_{36}$ film that was measured along the normal ($\parallel$) direction of the film plane.
Figure 3:
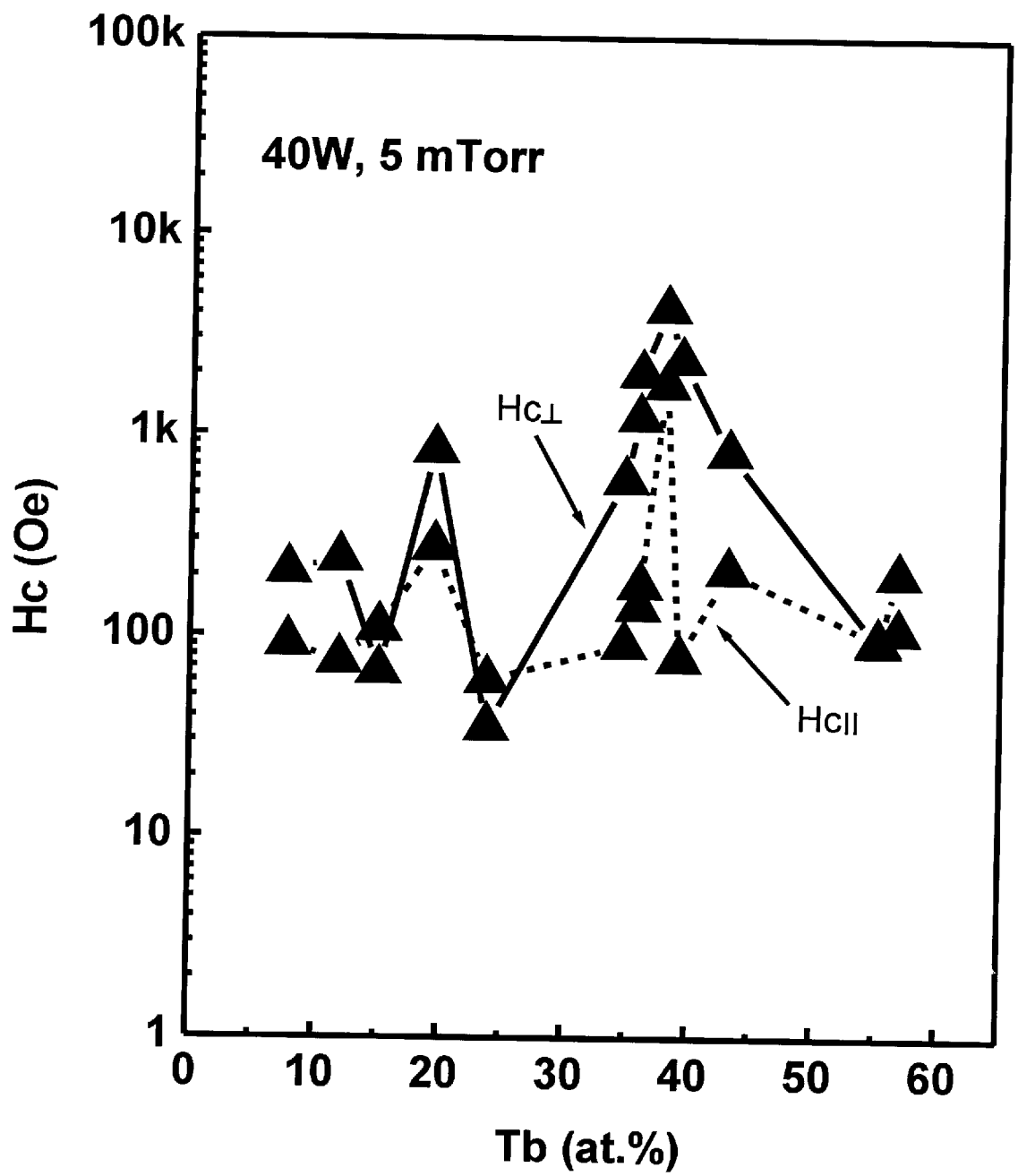
FIG. 3. is a diagram illustrating the variation of coercivities with Tb content of the as-deposited Co-Tb films. The dashed line is the in-plane coercivity (Hc$_\parallel$) and the solid line is the perpendicular coercivity (Hc$_\perp$). The sputtering power is 40 W and the Ar pressure is 5 mTorr.

The Co-Tb alloy of various compositions were used as targets and sputtered in an Ar gas atmosphere on a glass substrate. The initial substrate temperature was at room temperature (25° C.). The substrate rotates at a speed of 10 rpm. After the sputtering chamber was evacuated to $5 \times 10^{-7}$ Torr, Ar gas was introduced into the chamber. The Ar pressure was maintained at about 3 mTorr during the entire sputtering period. The deposition rate was 4 Å/sec at an applied DC power of 40 W. After deposition, a protective SiNx layer with thickness of 100 Å was produced on the film. FIG. 1. shows the relation between coercivity (Hc) and Tb content of the as-deposited Co-Tb films. The coercivity normal to the film plane ($Hc_\perp$) is very low when the Tb content is below 25 at. % (i.e. 25 atomic percent) and above 50 at. %. The maximum Hci occurred in the composition range between $Co_{65}Tb_{35}$ and $Co_{63}Tb_{37}$. When the Tb content is 36 at. % ( i.e., $Co_{64}Tb_{36}$), $Hc_\perp$ value is higher than 6000 Oe. However, the in-plane coercivity ($Hc_\parallel$) seems independent on the Tb content. The $Hc_\parallel$ value is lower than 400 Oe in the whole composition range. This $Co_{64}Tb_{36}$ thin film is suitable for perpendicular magnetic recording. FIG.2 shows the M-H loop of this as-deposited $Co_{64}Tb_{36}$ film measured along the normal ($\perp$) direction of the film plane. We can see that the $Hc_\perp$ value of this film is about 6500 Oe and the Ms value is 130 emu/cm$_3$. FIG.3(a). is the TEM photograph of this as-deposited $Co_{64}Tb_{36}$ film. It has a lemon peel-like microstructure if we examine it in detail. The diameter of lemon peel-like bumps is very small and it is about 60 Å. The diffraction pattern of this lemon peel-like structure is a broad halos and can not be estimated the lattice spacing, as shown in FIG.3(b). It is obvious that this film has an amorphous structure.

EXAMPLE 2

Figure 4A:
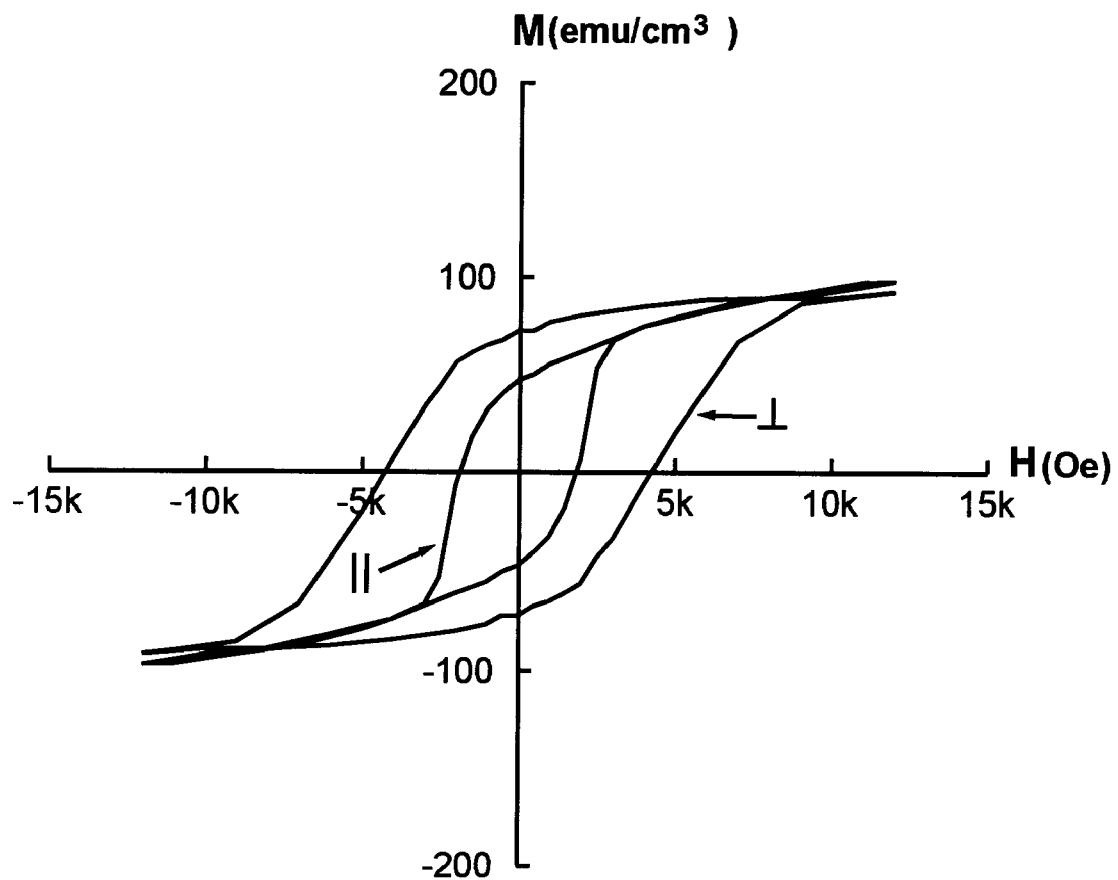
FIGS. 4A and 4B are diagrams illustrating the M-H loops measured along the directions of normal ($\perp$) and parallel ($\parallel$) to the film plane of the Co$_{62}$Tb$_{38}$ film; (a) is the as deposited, the sputtering power is 40 W and the Ar pressure is 5 mTorr; (b) is the film after annealing in vacuum at 250° C. for 60 minutes.

The Co-Tb alloy of various compositions were used as targets and sputtered in an Ar gas atmosphere on the glass substrate. The initial substrate temperature was at room temperature (25° C.). The substrate rotates at a speed of 10 rpm. After the sputtering chamber was evacuated to $5 \times 10^{-7}$ Torr, Ar gas was introduced into the chamber. The Ar pressure was maintained at about 5 mTorr during the entire sputtering period. The deposition rate was 4 Å/sec with an applied DC power of 40 W. After deposition, a protective SiNx layer with a thickness of 100 Å was produced on the film. The relation between coercivities and Tb contents of the as-deposited films is shown in FIG. 4. For these films, the coercivity normal to the film plane ($Hc_\perp$) is higher than 1000 Oe when the Tb content is between 36 at. % and 39 at. %. The maximum coercivity is about 4230 Oe that occurred at the composition of $Co_{62}Tb_{38}$. It is worth noting that the in-plane coercivity ($Hc_\parallel$) almost has the same tendency as that of out-plane coercivity $Hc_\perp$ within this composition range. However, the maximum value of $Ho_\parallel$ is only 1770 Oe. Comparing FIG. 4. with FIG. 1. , we can see that $Hc_\parallel$ and $Hc_\perp$ are varied with the change of Ar pressure. As Ar pressure is increased from 3 mTorr to 5 mTorr, the maximum $Hc_\perp$ of the film is decreased from 6000 Oe to 4230 Oe. But, $Hc_\parallel$ is increased from 200 Oe to 1770 Oe at Tb=38 at. %. The magnetic anisotropy of the film changes from perpendicular to isotropic. This my be due to the microstructure variation of amorphous film caused by the change of sputtering Ar pressure(S-C. N. Cheng and M. H. Kryder, "Thermal Stability of Anisotropy in TbFe Films Prepared by DC-Magnetron Sputtering", J. Appl. Phys. 70(10), pp.5526–5532, 1991.).

EXAMPLE 3

Figure 4B:
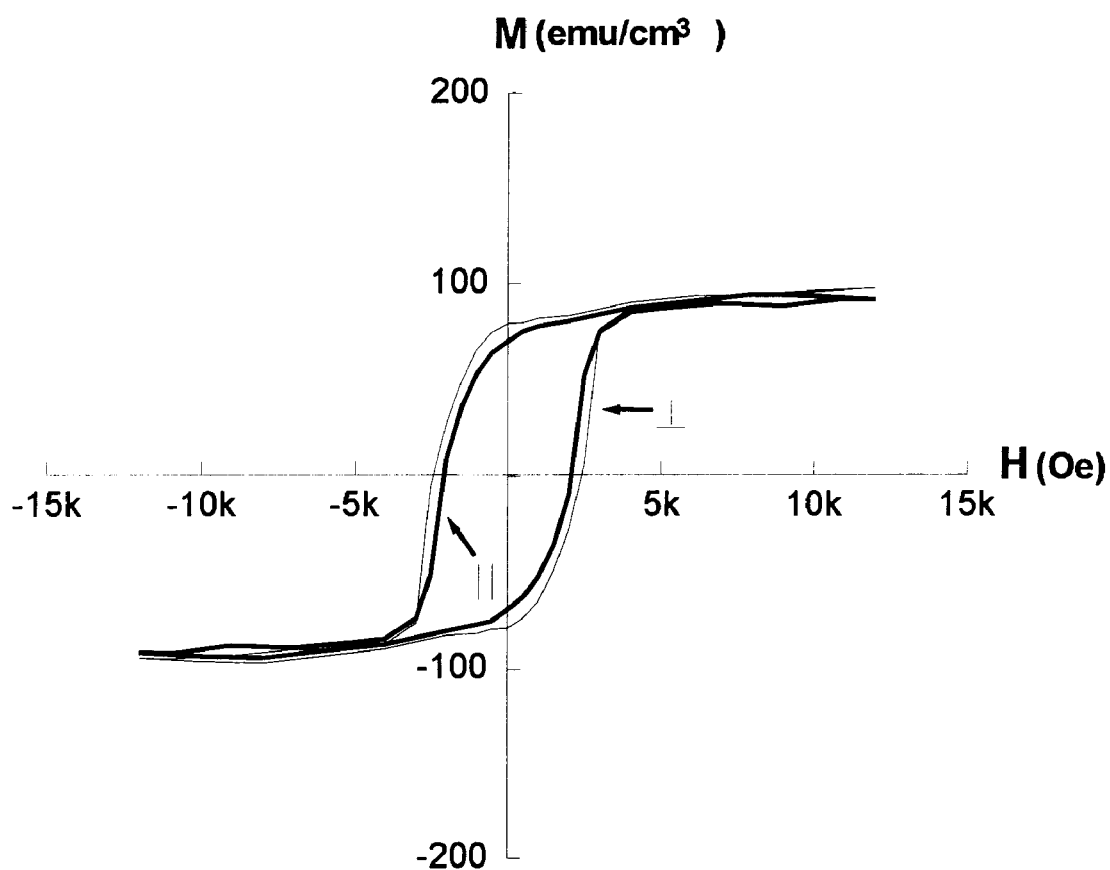
Figure 5:
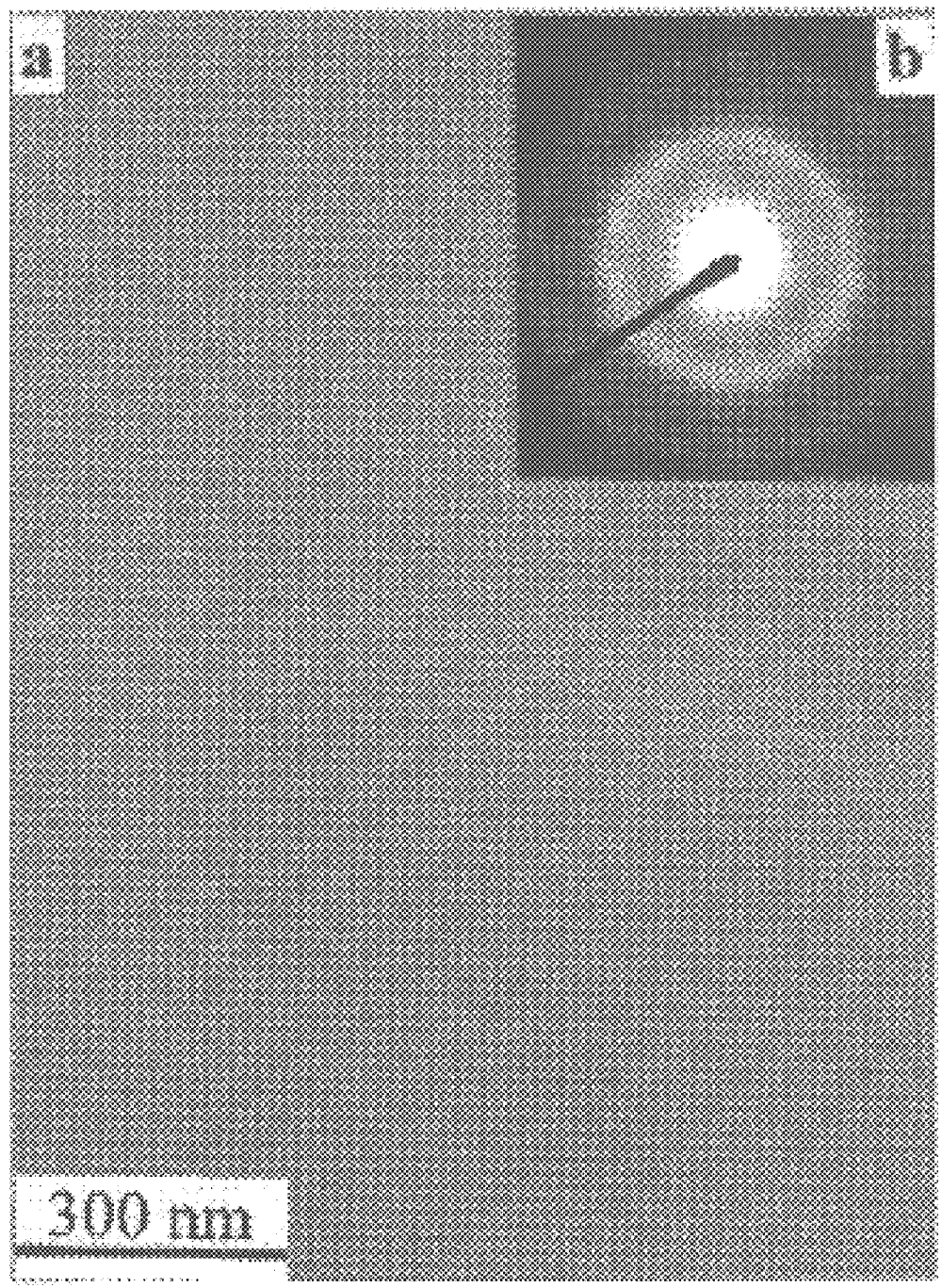
FIG. 5. is the TEM photo and diffraction pattern of the CO$_{64}$Tb$_{36}$ film. The sputtering power is 40 W and the Ar pressure is 3 mTorr; (a) is the TEM microstructure of the film and (b) is its diffraction pattern.
Figure 6:
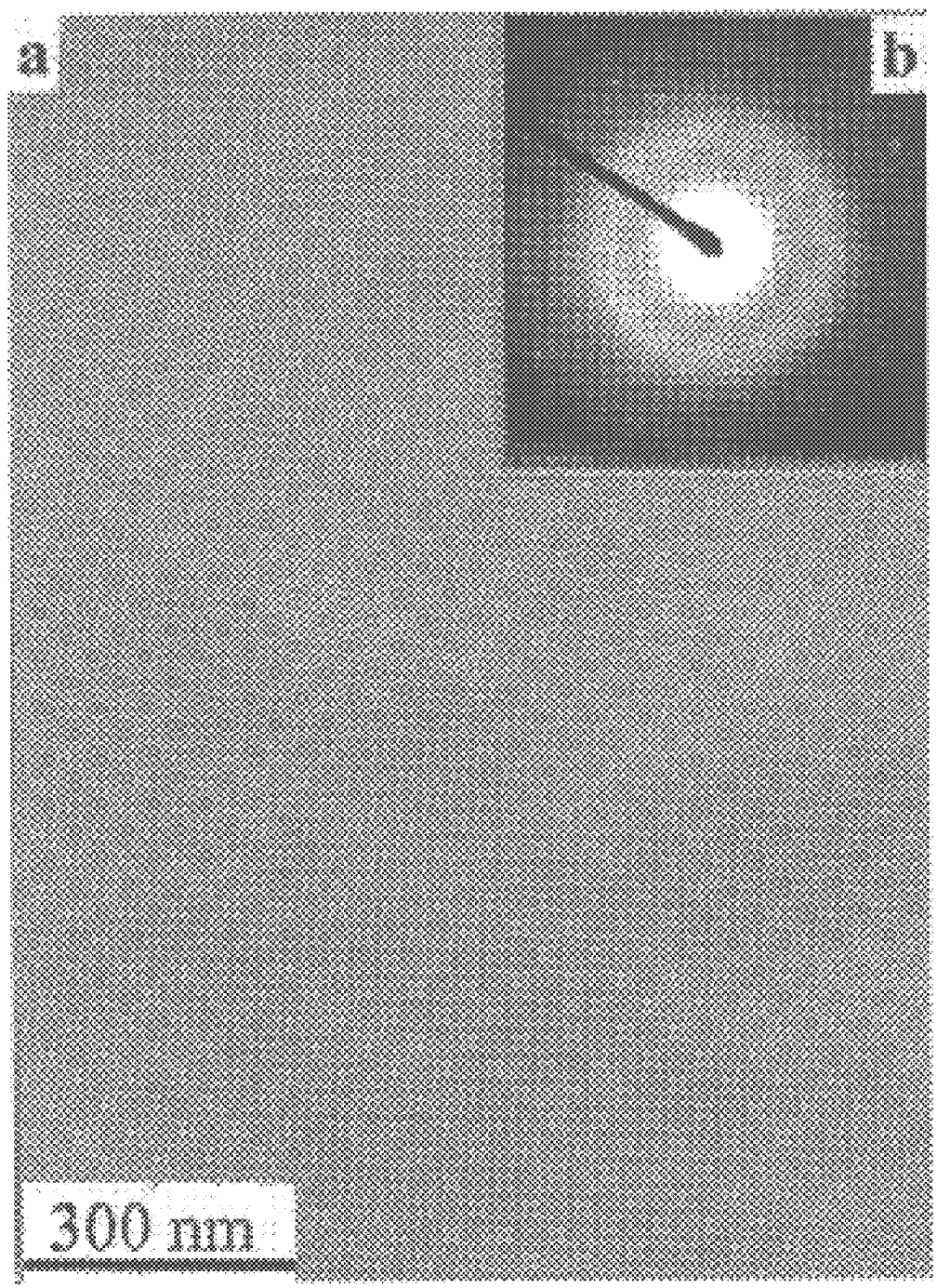
FIG. 6. is the TEM photo and diffraction pattern of the Co$_{62}$Tb$_{38}$ film which annealed at 250 for 60 minutes. The sputtering power is 40 W and the Ar pressure is 5 mTorr; (a) is the TEM microstructure of the film and (b) is its diffraction pattern.

The Co-Tb alloy with a composition of 38 at. % Tb was used as a target and the sputtering condition was the same as example 2. The substrate temperature was 25° C. After the Co-Tb film is deposited, a protective SiNx layer with thickness of 100 Å was produced on the film. The films were then annealed in a vacuum furnace for 60 minutes. The annealing temperature was varied from 100° C. to 250° C . The temperature was kept constant during the entire annealing period. The magnetic properties of the resulting films were determined. The M-H curves of the as-deposited $Co_{62}Tb_{38}$ film that deposited at the same sputtering conditions as example 2. The measuring applied fields were in both directions of parallel ($\parallel$) and normal ($\perp$) to the film plane. For this film, the in-plane coercivity ($Hc_\parallel$) is 1770 Oe and out-plane coercivity ($Hc_\perp$) is 4230 Oe. The Ms value of this film is 100 emu/cm$^3$. After this film is annealed in vacuum at 250° C. for 60 minutes, FIG. 4(b) shows the M-H curves of this annealed film. These M-H curves show that the film exhibits nearly isotropic magnetic characteristics, the in-plane coercivity ($Hc_{\parallel}$) is 2080 Oe and out-plane coercivity ($Hc_{\perp}$) is 2460 Oe. The Ms value of this film is about 100 emu/cm$^3$. This film can be used as longitudinal magnetic recording medium. The annealed $Co_{62}Tb_{38}$ films also have amorphous structure. FIG. 6(a) is the TEM photograph of the $Co_{62}Tb_{38}$ film that annealed at 250. We can see that it also has a lemon peel-like microstructure. The diameter of this lemon peel-like bumps is about 37 Å.

The method may be carried out wherein the atomic ratio of Co:Tb is about 64:36 and wherein the atomic ratio of Co:Tb is about 62:38.

REFERENCES

[1] Jian-Gang Zhu, "Transition Noise Properties in Longitudinal Thin Film Media", IEEE Trans. Magn. Vol.29, no.1, pp.195–200, 1993

[2] Shaun E. Mckinlay et al., "Microstructure/Magnetic Property Relationships in CoCrPt Magnetic Thin Films", IEEE Trans. Magn. Vol.32, no.5, pp.3587–3589, 1996

[3] D. N. Lambeth, E. M. T. Velu, G. H. Bellesis, L. L. Lee, and D. E. Laughlin, "Media for 10 Gb/in$^2$ Hard Disk Storage: Issues and Status" J. Appl. Phys., 78(8), pp.4496–4501, 1996

[4] J. Nakai, M. Kuwabara, A. Kikuchi, T. Sakurai, T. Shimatsu and M. Takahashi, "Effect of Microstructure on Media Noise of CoCrTa Thin Film Media Fabricated under Ultra Clean Sputtering Process", IEEE Trans. Magn. Vol. 31, no.6, pp.2833–2835, 1995

[5] G. Choe, "Effect of Film Morphology on Grain Boundary Segregation Induced Magnetic Properties in Heat Treated CoCrPt/Cr Films", IEEE Trans. Magn. Vol.31, no.6, pp.2809–2811, 1995

[6] I. Kaitsu et al., "Magnetic Properties and Structure of (Co-alloy)-$SiO_2$ Granular Films" IEEE Trans. Magn., Vol.32, no.5, pp.3813–3815, 1996

[7] G. Zangari and D. N. Lambeth, "Porous Aluminum Oxide Templates for Nanometer-Sized Magnetic Arrays", IEEE Trans. Magn., Vol.33, no.5, pp.3010–3012, 1997

[8] T. Niihara, S. Takayama, K. Kaneko, and Y. Sugita, "Perpendicular Anisotropy of Tb-Co Amorphous Films Sputtered in $H_2$-added Ar gas", Appl. Phys. Lett. 45(8), pp. 872–874, 1984

[9] T. Niihara, S. Takayama and Y. Sugita, "Perpendicular Anisotropy in Tb-Fe and Tb-Co Amorphous Films Sputtered in $H_2$-added Ar gas", IEEE Trans. Magn. Vol.21, no.5, pp.1638–1640, 1985

[10] Seiji Yoshino, Hiroshi Takagi, and Shigeru Tsunashima, Mroio Masuda and Susumu Uchiyama, "Perpendicular Magnetic Anisotropy of TbCo Films", Japan. J. Apply. Phys., 23, pp.188–191, 1984

[11] M. Ohkoshi, M. Harada, T. Tokunaga, S. Honda and T. Kusuda, "Effects of Ar Pressure and Substrate Bias on Magnetic Properties and Microstructure in Amorphous TbCo Sputtered Films", IEEE Trans. Magn. Vol.21, no.5, pp.1635–1637, 1985

[12] S. Honda, M. Ohkoshi and T. Kusuda, "Change of Magnetic Properties in Compositionally Modulated TbCo Sputtered Films", IEEE Trans. Magn. Vol.22, no.5, pp.1221–1223, 1986

[13] P. Hansen, in and book of Magnetic Materials ed. by K. H. J. Buschow, (Elsevier Sci. Publ. B. V., 1991), Vol.6, Chap. 4, p.310

[14] S-C. N. Cheng and M. H. Kryder, "Thermal Stability of Anisotropy in TbFe Films Prepared by DC-Magnetron Sputtering", J. Appl. Phys. 70(10), pp.5526–5532, 1999.

What is claimed is:

1. A method for producing a longitudinal magnetic recording medium comprising the steps of: forming an 100 Å-SiNx protected amorphous Co-Tb film with $Hc_{\perp}$=4230 Oe by magnetron sputtering, and applying a heat treatment on the amorphous Co-Tb film to transform the film to a magnetic isotropic amorphous Co-Tb film having magnetic properties of Ms=100 emu/cm$^3$ and $Hc_{\parallel}$=2080 Oe wherein the the atomic ratio of Co:Tb is in the range of 72:28 to 45:55.

2. The method of claim 1, wherein the amorphous Co-Tb film is sputtered onto a substrate that is at a temperature of about 25 degrees Celsius.

3. The method of claim 1, wherein the heat treatment temperature is about 250 degrees Celsius for a time of about 60 minutes.

4. The method of claim 1, wherein the atomic ratio of Co:Tb is about 64:36.

5. The method of claim 1, wherein the atomic ratio of Co:Tb is about 62:38.

6. The method of claim 1, wherein the power supply for the magnetron sputtering is selected from the group consisting of DC and RF, and the substrate is not biased.

7. The method of claim 1, wherein the magnetron sputtering occurs using a target selected from the group consisting of an Co-Tb alloy and a composite target of an Co disk overlaid with terbium pieces.

8. The method of claim 1, wherein the amorphous Co-Tb film is sputtered onto a glass substrate.

9. The method of claim 1, wherein the sputtering occurs at an argon pressure of 0.3~10 mTorr.

10. The method of claim 1, wherein the sputtering occurs at an argon pressure of 3 mTorr.

11. The method of claim 1, wherein the sputtering occurs at an argon pressure of 5 mTorr.

* * * * *